United States Patent
Li et al.

(10) Patent No.: US 9,897,882 B1
(45) Date of Patent: Feb. 20, 2018

(54) METHODS OF FABRICATING COA TYPE LIQUID CRYSTAL DISPLAY PANELS AND COA TYPE LIQUID CRYSTAL DISPLAY PANELS

(71) Applicant: Shenzhen China Star Optoelectronics Technology Co., Ltd., Shenzhen (CN)

(72) Inventors: Ji Li, Shenzhen (CN); Xiaolong Ma, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 261 days.

(21) Appl. No.: 14/908,539

(22) PCT Filed: Dec. 29, 2015

(86) PCT No.: PCT/CN2015/099618
§ 371 (c)(1),
(2) Date: Jan. 29, 2016

(87) PCT Pub. No.: WO2017/092130
PCT Pub. Date: Jun. 8, 2017

(30) Foreign Application Priority Data

Dec. 4, 2015  (CN) .......................... 2015 1 0888688

(51) Int. Cl.
*G02F 1/1335*  (2006.01)
*G02F 1/1368*  (2006.01)
(Continued)

(52) U.S. Cl.
CPC ........ *G02F 1/1368* (2013.01); *C09K 19/2007* (2013.01); *C09K 19/3068* (2013.01);
(Continued)

(58) Field of Classification Search
CPC ....... G03F 7/0007; G02B 5/201; G02B 5/206; G02F 2001/136222; G02F 1/133516;
(Continued)

(56) References Cited

U.S. PATENT DOCUMENTS

2013/0341588 A1* 12/2013 Jeon ........................ G02F 1/174
257/13
2016/0070136 A1*  3/2016 Jang .................. G02F 1/133514
349/61
(Continued)

FOREIGN PATENT DOCUMENTS

CN         104991374 A  * 10/2015
WO    WO 2016/009859 A1 *  1/2016

OTHER PUBLICATIONS

Computer-generated translation of JP 2016 029149 (Mar. 2016).*
Computer-generated translation of CN 104991374 (Oct. 2015).*

*Primary Examiner* — John A McPherson
(74) *Attorney, Agent, or Firm* — Leong C. Lei

(57) ABSTRACT

The present application provides a method of fabricating a COA type liquid crystal display panel and the COA type liquid crystal display panel, which utilizes reactive liquid crystal, reactive monomers, red quantum-rods and green quantum-rods to fabricate a color filter thin film. Due that light generated by the red and green quantum rods in the color filter thin film when they are excited are polarized light, and the red and green quantum rods therein are arranged along the same direction, the excited red and green quantum rods generate red and green linear polarized light conforming to the polarized direction so as to play a role of a lower polarizer and to allow the COA type liquid crystal display panel fabricated by the method not only obtain bright trichromatic light for increasing color saturation, but also omit the lower polarizer for reducing fabrication cost.

12 Claims, 7 Drawing Sheets

(51) Int. Cl.
  *G02F 1/1333* (2006.01)
  *G02F 1/1337* (2006.01)
  *G02F 1/1341* (2006.01)
  *G02F 1/1334* (2006.01)
  *G02F 1/1343* (2006.01)
  *G02F 1/1339* (2006.01)
  *C09K 19/30* (2006.01)
  *G03F 7/00* (2006.01)
  *C09K 19/20* (2006.01)
  *G02F 1/1362* (2006.01)

(52) U.S. Cl.
  CPC .......... *G02F 1/1334* (2013.01); *G02F 1/1339* (2013.01); *G02F 1/1341* (2013.01); *G02F 1/13394* (2013.01); *G02F 1/13439* (2013.01); *G02F 1/133345* (2013.01); *G02F 1/133528* (2013.01); *G02F 1/133617* (2013.01); *G02F 1/133621* (2013.01); *G02F 1/133788* (2013.01); *G02F 1/136209* (2013.01); *G03F 7/0007* (2013.01); *C09K 2019/2035* (2013.01); *C09K 2019/2078* (2013.01); *G02F 2001/13345* (2013.01); *G02F 2001/13398* (2013.01); *G02F 2001/13415* (2013.01); *G02F 2001/133614* (2013.01); *G02F 2001/136222* (2013.01); *G02F 2201/121* (2013.01); *G02F 2201/123* (2013.01); *G02F 2202/36* (2013.01)

(58) Field of Classification Search
  CPC .......... G02F 1/133528; G02F 1/13362; G02F 2001/133614; G02F 1/133621; G02F 1/133788; G02F 1/133633; G02F 1/133617
  USPC .............................................. 430/7; 349/106
  See application file for complete search history.

(56) References Cited

U.S. PATENT DOCUMENTS

2016/0209706 A1* 7/2016 Miki .................. G02F 1/133617
2017/0153502 A1* 6/2017 Wang ................. G02F 1/133617
2017/0256752 A1* 9/2017 Gee ..................... H01L 51/5281

* cited by examiner

METHODS OF FABRICATING COA TYPE LIQUID CRYSTAL DISPLAY PANELS AND COA TYPE LIQUID CRYSTAL DISPLAY PANELS

FIELD OF THE INVENTION

The present application relates to display technology field, specifically to a method of fabricating a COA type liquid crystal display panel and the COA type liquid crystal display panel.

BACKGROUND OF THE INVENTION

With the development of display technology, flat display devices of liquid crystal displays (LCD) and the like have advantages of high quality, energy saving, thin body and wide application range, etc., so the devices are widely applied to various consumer electronic products of cell phones, televisions, personal digital assistants, digital cameras, notebook computers, desktop computers and the like, and the devices become the mainstream display devices.

Most liquid crystal display devices in current market are backlight type liquid crystal display devices, which include liquid crystal display panels and backlight modules. The liquid crystal display panel is usually consisting of a color filter (CF) substrate, a thin film transistor (TFT) substrate, liquid crystal interposed between the CF substrate and the TFT substrate, and a sealant. However, the liquid crystal display panel of such structure often occurs a problem of poor alignment between the CF substrate and the TFT substrate, and the problem causes pixel light leakage, low aperture ratio or other issues. In order to overcome the said problems, a liquid crystal display panel of color filter on array (COA) structure is produced, and the COA technique is a technique that the color filter layer is prepared on the TFT substrate so as to form the CF. The liquid crystal display panel of the COA structure does not have the problem of alignment between the CF substrate and the array substrate, so difficulty of cell alignment process during display panel fabrication process can be reduced, deviation of cell alignment can be obviated, and thus black matrix can be designed as narrow linewidth to increase the aperture ratio.

Generally, the display principle of the liquid crystal display panel is that the backlight passes through the lower polarizer to form polarized light of polarization direction parallel to transmission axis of the lower polarizer. The polarized light passes through red, green and blue (RGB) color filter then to form tri-color polarized light of RGB. After the tri-color polarized light of RGB passed through the liquid crystal layer, the tri-color polarization direction thereof is adjusted, and the tri-color polarized light of RGB passes though upper polarizer (the liquid crystal display panel of the COA structure); or the tri-color polarized light of RGB passes the liquid crystal layer, then passes the RGB color filter layer to form the tri-color polarized light of RGB, and passes through the upper polarizer to emit light (the liquid crystal display panel of the common structure). No matter what kind the structure of liquid crystal display panel is, the liquid crystal layer therein acts as a valve for controlling light passing amount. The most important two factors of the display principle are the polarized light and RGB trichromatic.

Currently, due that a quantum dot (QD) which is excited by the backlight can emit light with characteristics of narrow wavelength (small half peak), bright color (high color density) and the like, a lot of technology focus on the application of the quantum dots in the liquid crystal display panel to enhance color saturation of the liquid crystal display panel. It is unlike the quantum dot that light emitted by a quantum rod (QR) can be polarized light; and a wavelength of the light emitted by the quantum rod can be controlled by controlling a diameter of the quantum rod.

SUMMARY OF THE INVENTION

An aspect of the present application is to provide a method of fabricating a COA type liquid crystal display panel, by using reactive liquid crystals, reactive monomers, red quantum rods and green quantum rods to fabricate a color filter thin film, the COA type liquid crystal display panel fabricated by the method can not only obtain bright trichromatic for increasing color saturation, but also omit the lower polarizer for reducing fabrication cost, due that the color filter thin film can transform the backlight into polarized light.

Another aspect of the present application is to provide a COA type liquid crystal display panel, which has not only higher color saturation but also no need to use lower polarized so as to reduce fabrication cost.

For achieving the above aspects, the present application provides a method of fabricating a COA type liquid crystal display panel including steps as follows:

step 1, providing a TFT substrate, wherein the TFT substrate includes a first substrate, a TFT layer disposed on the first substrate, a passivation layer disposed on the TFT layer, fabricating a black matrix on the TFT substrate, wherein the black matrix partitions the TFT substrate into a plurality of sub pixel regions, which includes red sub pixel regions, green pixel regions and blue pixel regions;

step 2, coating an alignment material layer on the TFT substrate and the black matrix, rubbing the alignment material layer to obtain a first alignment film;

step 3, dropping a mixture comprising reactive liquid crystals, reactive monomers, and red quantum rods in the red sub pixel regions, dropping a mixture including reactive liquid crystals, reactive monomers, and green quantum rods in the green sub pixel regions, dropping a mixture comprising reactive liquid crystals and reactive monomers in the blue sub pixel regions;

after the mixtures are dropped, all the reactive liquid crystals in the plurality of sub pixel regions are arranged along an alignment direction of the first alignment film, due that strong intermolecular forces are formed between the reactive liquid crystals and the red quantum rods in the red sub pixel regions, and formed between the reactive liquid crystals and the green quantum rods in the green sub pixel regions, the red quantum rods and the green quantum rods with the reactive liquid crystals are arranged along the same direction;

step 4, performing UV irradiation to the plurality of sub pixel regions, allowing the reactive monomers react with the reactive liquid crystals in each the sub pixel region to form a polymer network, so that arrangement directions of the red quantum rods in the red sub pixel regions and the green quantum rods in the green sub pixel regions are fixed by the polymer network, then respectively forming polymer thin films of red quantum rods in the red sub pixel regions, polymer thin films of green quantum rods in the green sub pixel regions, and polymer thin films in the blue sub pixel regions, so as to obtain a color filter film, which includes the polymer thin films of red quantum rods, the polymer thin films of green quantum rods, and the polymer thin films;

step 5, forming a pixel electrode layer on the color filter film, forming a second alignment film on the pixel electrode layer, forming photoresist spacers on the second alignment film corresponding to the black matrix, so as to obtain a lower substrate;

step 6, providing an upper substrate and an upper polarizer, wherein the upper substrate includes a second substrate, a common electrode layer disposed on the second substrate, and a third alignment film disposed on the common electrode layer;

performing a seal connection of the upper substrate and the lower substrate by using a box glue, and simultaneously priming liquid crystal molecules between the upper substrate and the lower substrate to form a liquid crystal layer, then adhering an upper polarizer above the upper substrate, so as to complete the fabrication of the COA type liquid crystal display panel.

A structural formula of the reactive liquid crystals is:

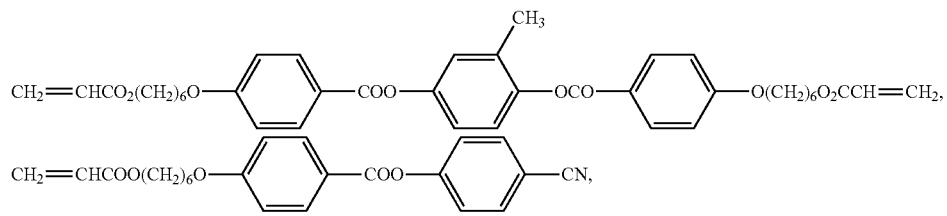

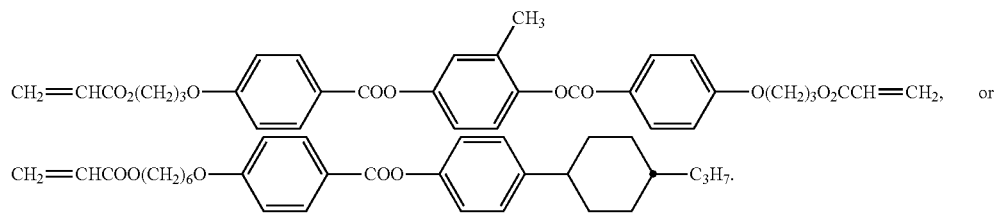

The reactive monomers are acrylates monomers containing two or more than two carbon-carbon double bonds.

The quantum rods are a quantum rod including a CdSe core and a CdS shell.

In step 1, the plurality of sub pixel regions further including white sub pixel regions; step 3 further including: dropping a mixture comprising reactive liquid crystals, reactive monomers, red quantum rods and green quantum rods in the white sub pixel regions; after the UV irradiation in step 4, forming polymer thin films of red and green quantum rods so as to obtain the color filter film, which further includes the polymer thin films of red and green quantum rods.

The present application further provides a COA type liquid crystal display panel, including: oppositely disposed an upper substrate and a lower substrate, a box glue disposed peripheral position between the upper substrate and the lower substrate, a liquid crystal layer interposed between the upper substrate and the lower substrate, and a upper polarizer adhered to an upper surface of the upper substrate;

wherein the lower substrate includes a TFT substrate, a black matrix disposed on the TFT substrate, a first alignment film disposed on the TFT substrate and the black matrix, a color filter film disposed on the first alignment film, a pixel electrode layer disposed on the color filter film, a second alignment film disposed on the pixel electrode layer, and photoresist spacers disposed on the second alignment film corresponding to the black matrix;

wherein the color filter film includes polymer thin films of red quantum rods, polymer thin films of green quantum rods, and polymer thin films; the polymer thin films of red quantum rods includes red quantum rods, and a polymer formed by performing UV irradiation to reactive liquid crystals and reactive monomers; the polymer thin films of green quantum rods includes green quantum rods, and a polymer formed by performing UV irradiation to reactive liquid crystals and reactive monomers; the polymer thin films includes a polymer by performing UV irradiation to reactive liquid crystals and reactive monomers; the polymer thin films of red quantum rods, the polymer thin films of green quantum rods, and the polymer thin films respectively emit red light, green light, and blue light under blue backlight irradiation.

The TFT substrate includes a first substrate, a TFT layer disposed on the first substrate, and a passivation layer disposed on the TFT layer; the upper substrate includes a second substrate, a common electrode layer disposed on the second substrate, and a third alignment film disposed on the common electrode layer.

The color filter film further includes polymer thin films of red and green quantum rods including red quantum rods, green quantum rods, and a polymer formed by performing UV irradiation to reactive liquid crystals and reactive monomers, and the polymer thin films of red and green quantum rods emit white light under blue backlight irradiation.

A structural formula of the reactive liquid crystals is:

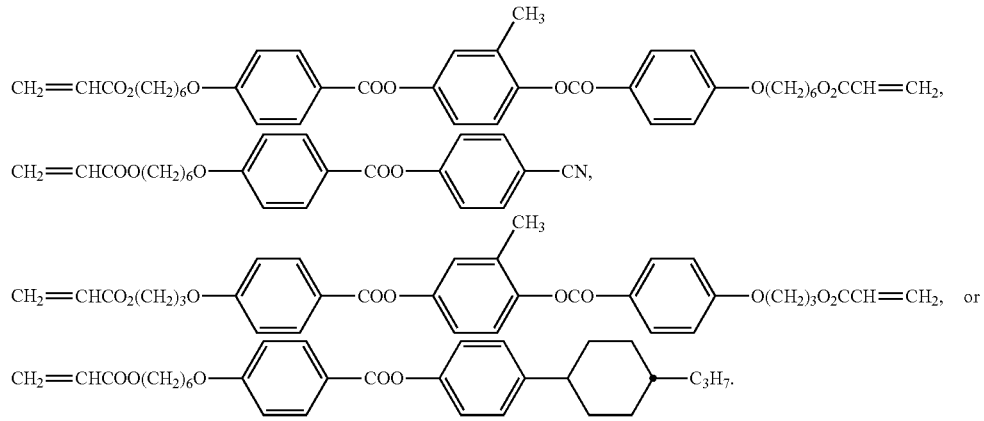

The reactive monomers are acrylates monomers containing two or more than two carbon-carbon double bonds; the quantum rods are a quantum rod comprising a CdSe core and a CdS shell.

The present application further provides a method of fabricating a COA type liquid crystal display panel, including steps as follows:

step 1, providing a TFT substrate, wherein the TFT substrate includes a first substrate, a TFT layer disposed on the first substrate, a passivation layer disposed on the TFT layer, fabricating a black matrix on the TFT substrate, wherein the black matrix partitions the TFT substrate into a plurality of sub pixel regions, which includes red sub pixel regions, green pixel regions and blue pixel regions;

step 2, coating an alignment material layer on the TFT substrate and the black matrix, rubbing the alignment material layer to obtain a first alignment film;

step 3, dropping a mixture including reactive liquid crystals, reactive monomers, and red quantum rods in the red sub pixel regions, dropping a mixture including reactive liquid crystals, reactive monomers, and green quantum rods in the green sub pixel regions, dropping a mixture comprising reactive liquid crystals and reactive monomers in the blue sub pixel regions;

after the mixtures are dropped, all the reactive liquid crystals in the plurality of sub pixel regions are arranged along an alignment direction of the first alignment film, due that strong intermolecular forces are formed between the reactive liquid crystals and the red quantum rods in the red sub pixel regions, and formed between the reactive liquid crystals and the green quantum rods in the green sub pixel regions, the red quantum rods and the green quantum rods with the reactive liquid crystals are arranged along the same direction;

step 4, performing UV irradiation to the plurality of sub pixel regions, allowing the reactive monomers react with the reactive liquid crystals in each the sub pixel region to form a polymer network, so that arrangement directions of the red quantum rods in the red sub pixel regions and the green quantum rods in the green sub pixel regions are fixed by the polymer network, then respectively forming polymer thin films of red quantum rods in the red sub pixel regions, polymer thin films of green quantum rods in the green sub pixel regions, and polymer thin films in the blue sub pixel regions, so as to obtain a color filter film, which includes the polymer thin films of red quantum rods, the polymer thin films of green quantum rods, and the polymer thin films;

step 5, forming a pixel electrode layer on the color filter film, forming a second alignment film on the pixel electrode layer, forming photoresist spacers on the second alignment film corresponding to the black matrix, so as to obtain a lower substrate;

step 6, providing an upper substrate and an upper polarizer, wherein the upper substrate includes a second substrate, a common electrode layer disposed on the second substrate, and a third alignment film disposed on the common electrode layer;

performing a seal connection of the upper substrate and the lower substrate by using a box glue, and simultaneously priming liquid crystal molecules between the upper substrate and the lower substrate to form a liquid crystal layer, then adhering an upper polarizer above the upper substrate, so as to complete the fabrication of the COA type liquid crystal display panel;

wherein a structural formula of the reactive liquid crystals is:

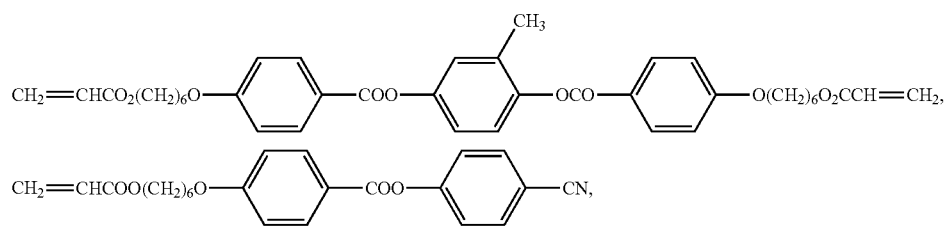

-continued

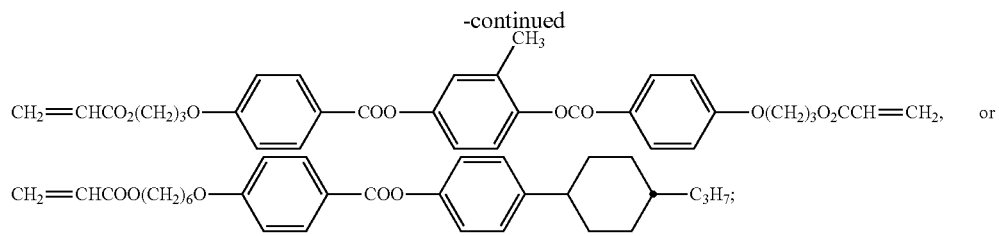

wherein the reactive monomers are acrylates monomers containing two or more than two carbon-carbon double bonds;

wherein the quantum rods are a quantum rod including a CdSe core and a CdS shell.

Advantages of the present application are that the present application provides a method of fabricating a COA type liquid crystal display panel and a COA type liquid crystal display panel, which utilizes reactive liquid crystal, reactive monomers, red quantum-rods and green quantum rods to fabricate a color filter thin film. Due that light generated by the red and green quantum rods in the color filter thin film when they are excited are polarized light, and the red and green quantum rods therein are arranged along the same direction, the excited red and green quantum rods generate red and green linear polarized light conforming to the polarized direction so as to play a role of a lower polarizer and to allow the COA type liquid crystal display panel fabricated by the method not only obtain bright trichromatic light for increasing color saturation, but also omit the lower polarizer for reducing fabrication cost.

For further illustrating features and techniques of the present application, please refer to following detail descriptions and accompanying drawings relative to the invention, however, the accompanying drawings are not intended to be exhaustive or to be limited to the present application.

BRIEF DESCRIPTION OF THE DRAWINGS

The technical features and advantages of the present application will become more readily apparent through the detailed description of embodiments and following accompanying drawings, in which.

DETAILED DESCRIPTION OF PREFERRED EMBODIMENTS

For further illustrating the techniques and effects adopted by the present application, the preferable embodiments of the present application and accompanying drawings will be described in more detail as follows.

Figure 1:
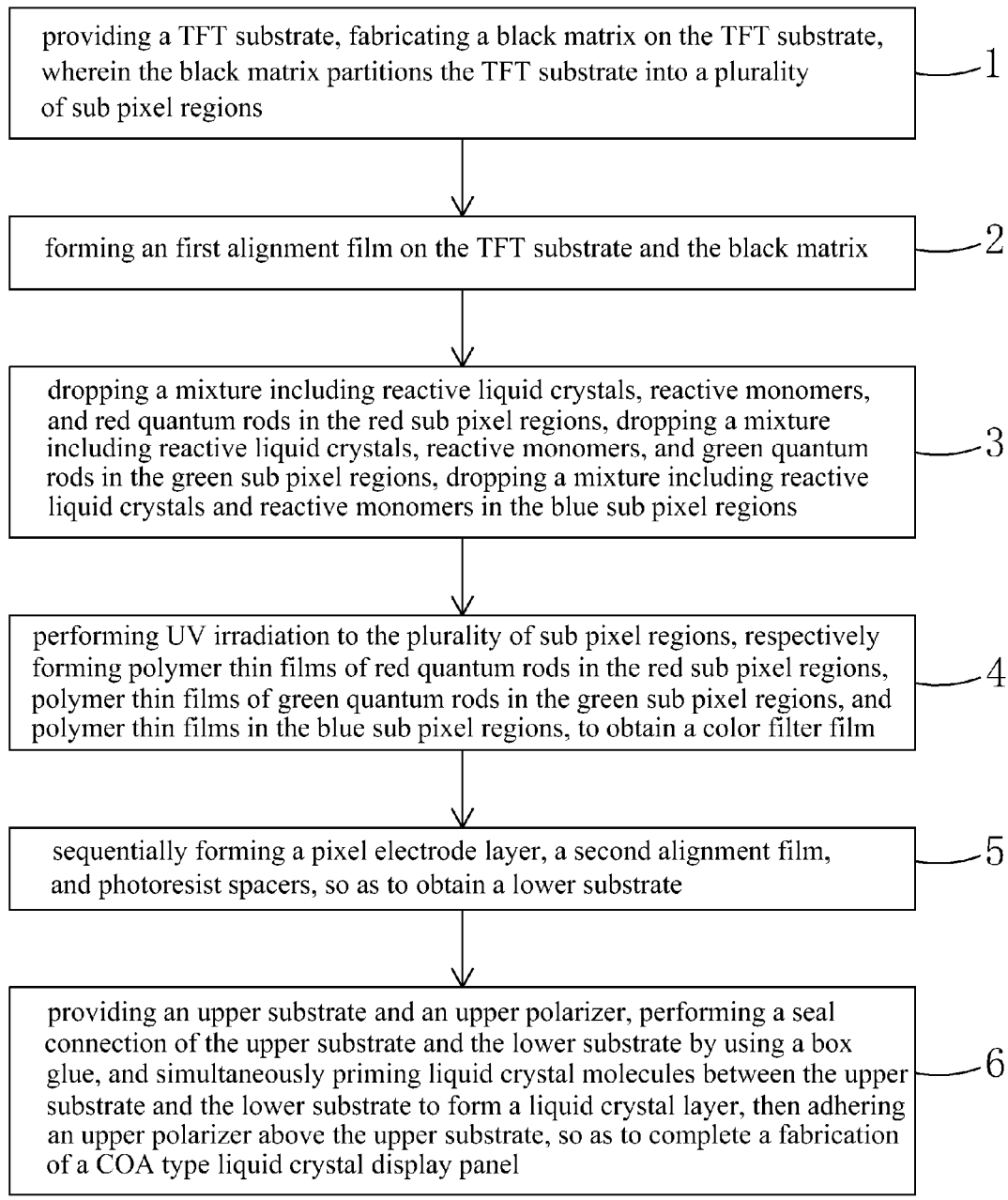
FIG. 1 is a schematic flow chart illustrating a method of fabricating a COA type liquid crystal display panel of the present application.

Please refer to FIG. 1, the present application provides a method of fabricating a COA type liquid crystal display panel, including steps as follows.

Figure 2:
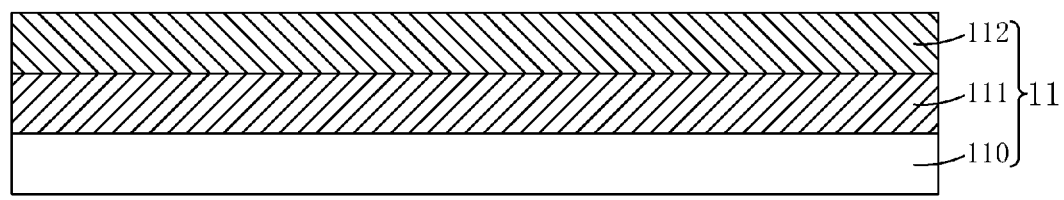
FIGS. 2-4 are schematic diagrams illustrating step 1 of the method of fabricating the COA type liquid crystal display panel of the present application.
Figure 3:
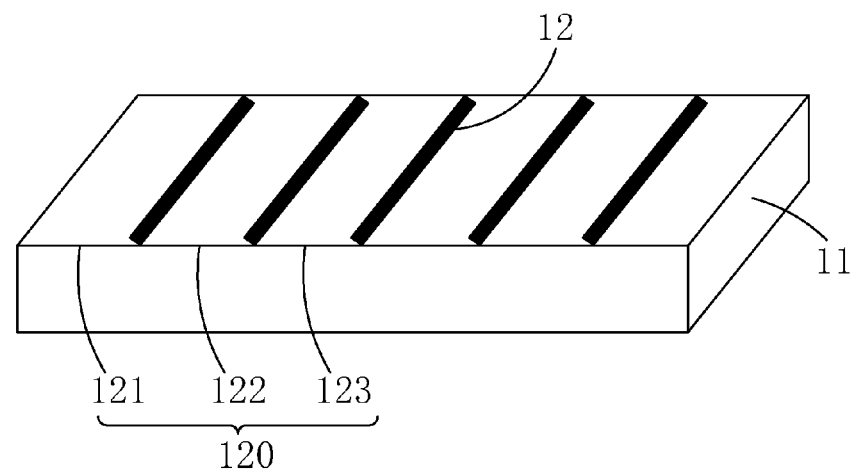
Figure 4:
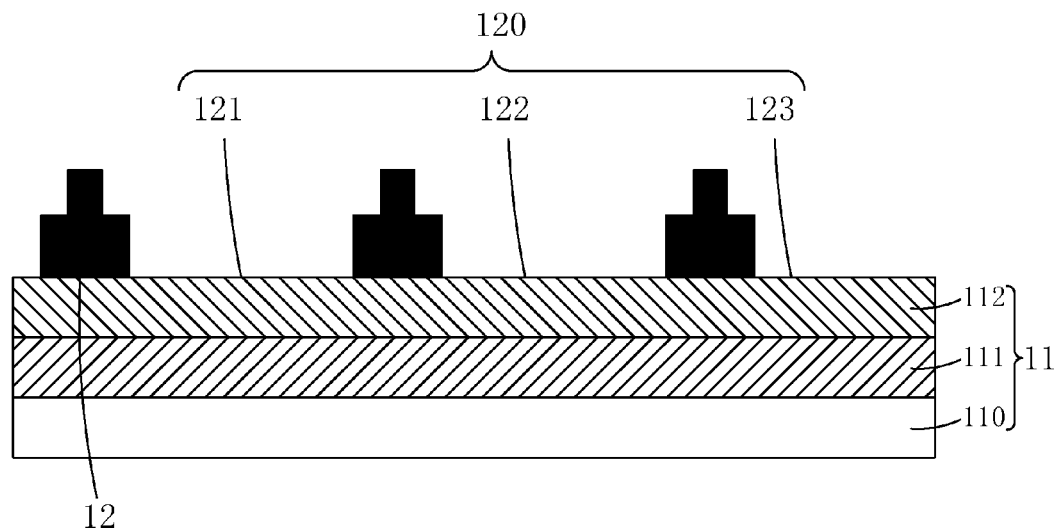

Step 1, as shown in FIGS. 2-4, providing a TFT substrate 11, wherein the TFT substrate 11 includes a first substrate 110, a TFT layer 111 disposed on the first substrate 110, a passivation layer 112 disposed on the TFT layer 111, and a black matrix 12 fabricated on the TFT substrate 11, the black matrix 12 partitions the TFT substrate 11 into a plurality of sub pixel regions 120, which includes red sub pixel regions 121, green pixel regions 122 and blue pixel regions 123.

Specifically, the black matrix 12 simultaneously plays both roles of a barrier wall and light shield of RGB pixels.

Figure 5:
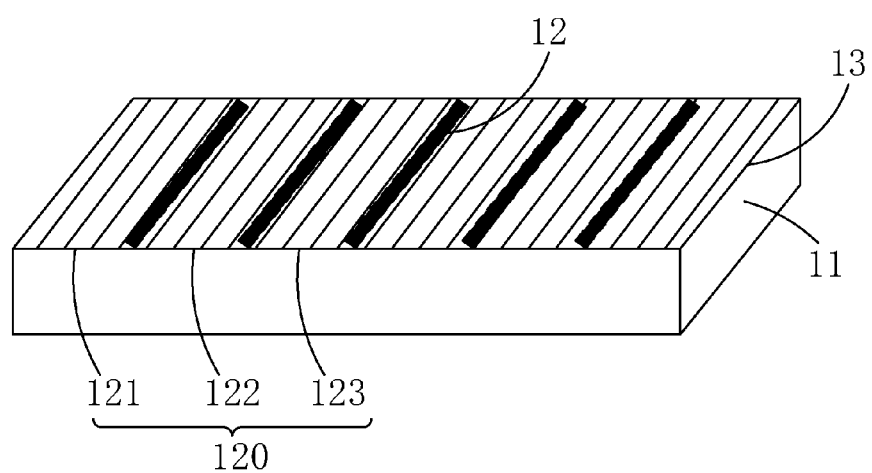
FIGS. 5-6 are schematic diagrams illustrating step 2 of the method of fabricating the COA type liquid crystal display panel of the present application.
Figure 6:
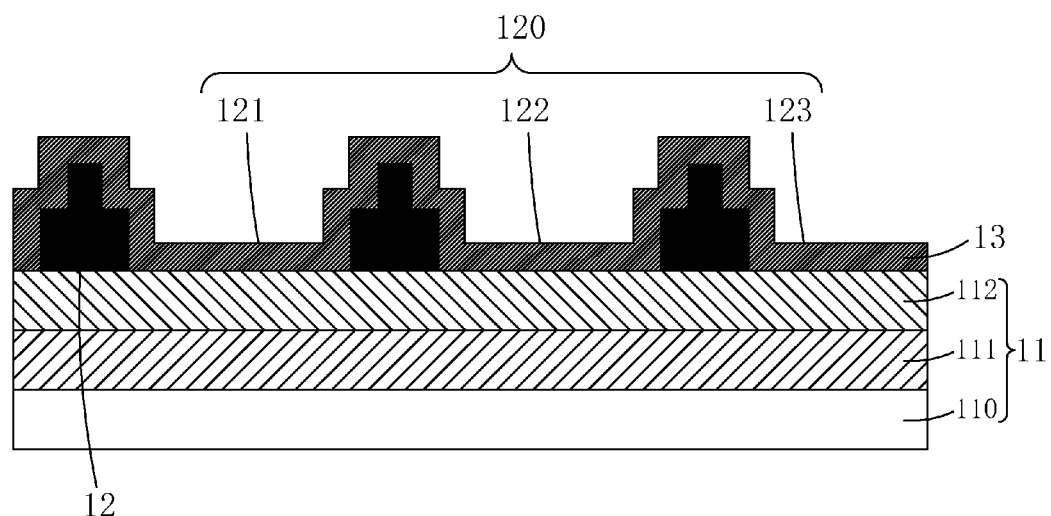

Step 2, as shown in FIGS. 5-6, coating an alignment material layer on the TFT substrate 11 and the black matrix 12, and rubbing the alignment material layer to obtain a first alignment film 13.

Figure 7:
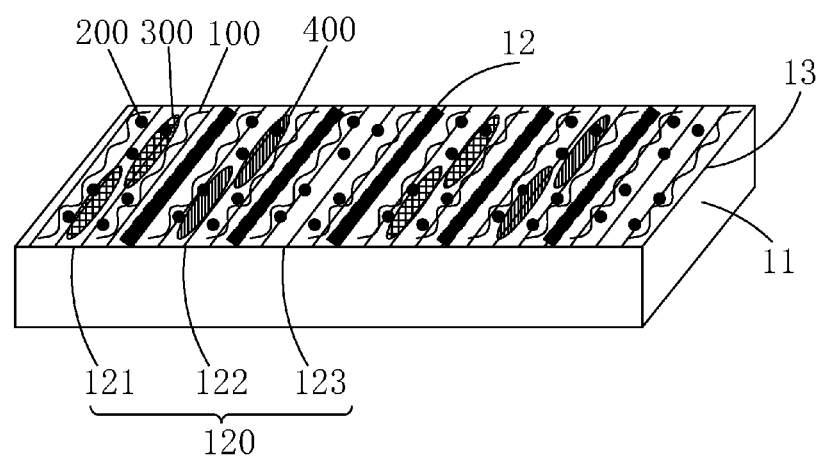
FIG. 7 is a schematic diagram illustrating step 3 of the method of fabricating the COA type liquid crystal display panel of the present application.

Step 3, as shown in FIG. 7, dropping a mixture including reactive liquid crystals 100, reactive monomers 200, and red quantum rods 300 in the red sub pixel regions 121, dropping a mixture including reactive liquid crystals 100, reactive monomers 200, and green quantum rods 400 in the green sub pixel regions 122, dropping a mixture including reactive liquid crystals 100 and reactive monomers 200 in the blue sub pixel regions;

after the mixtures are dropped, all the reactive liquid crystals 100 in the plurality of sub pixel regions 120 are arranged along an alignment direction of the first alignment film 13, due that strong intermolecular forces are formed between the reactive liquid crystals 100 and the red quantum rods 300 in the red sub pixel regions 121, and formed between the reactive liquid crystals 100 and the green quantum rods 400 in the green sub pixel regions 122, the red quantum rods 300 and the green quantum rods 400 with the reactive liquid crystals 100 are arranged along the same direction.

Specifically, in the mixture of each the sub pixel region 120, a mass percentage of the reactive monomers 200 is greater than 90% that forms an extremely high concentration, and the reactive monomers 200 can rapidly form a polymer network under UV irradiation.

Specifically, the reactive liquid crystals (R-LC) 100 can be a liquid crystal molecule containing rigid ring structures, intermediate linking groups, and double bond structure contained in molecule terminal, such as:

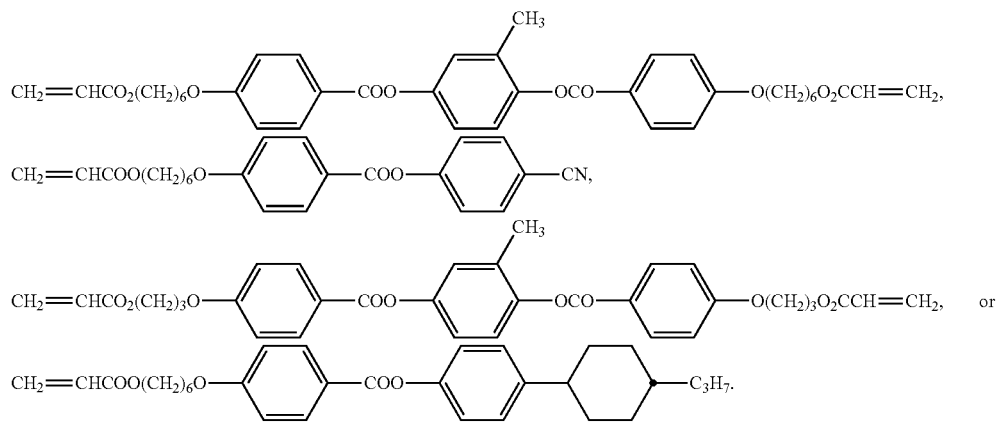

Specifically, the reactive monomers (RM) 200 can be acrylates monomers containing two or more than two carbon-carbon double bonds, such as:

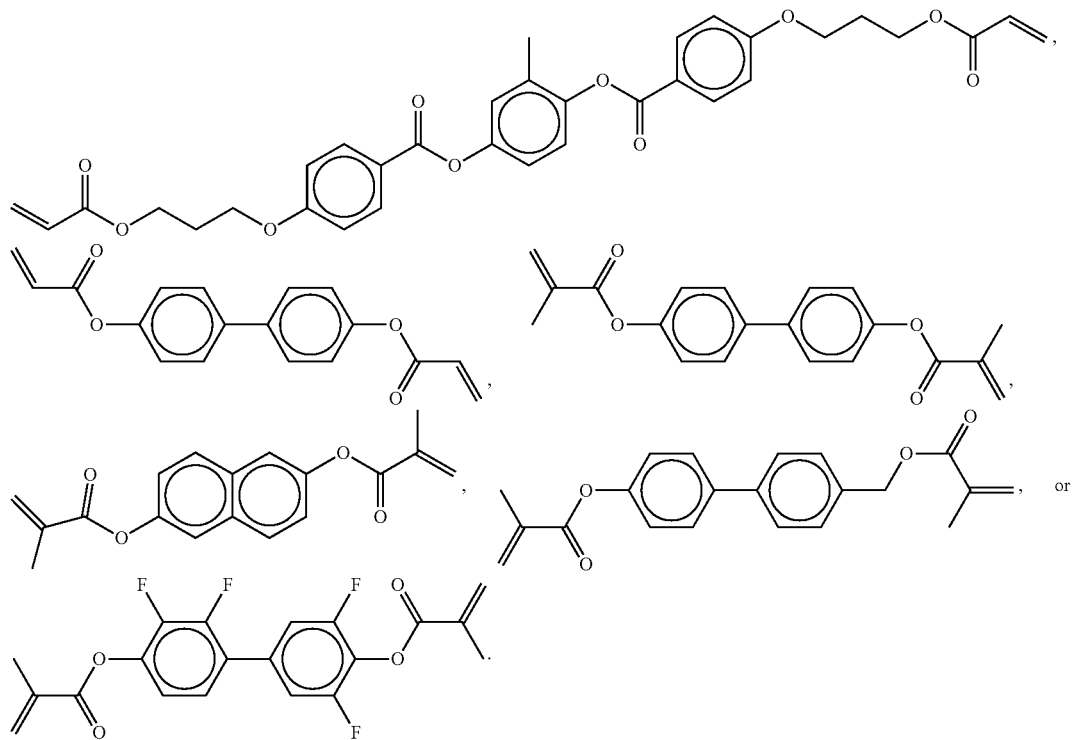

Specifically, the quantum rods (QR) are a quantum rod including a CdSe core and a CdS shell. The quantum rods can emit red or green light after they are excited, the light emitted by the quantum rods can be controlled by a dimension of the core (i.e. a diameter of the core).

Figure 8:
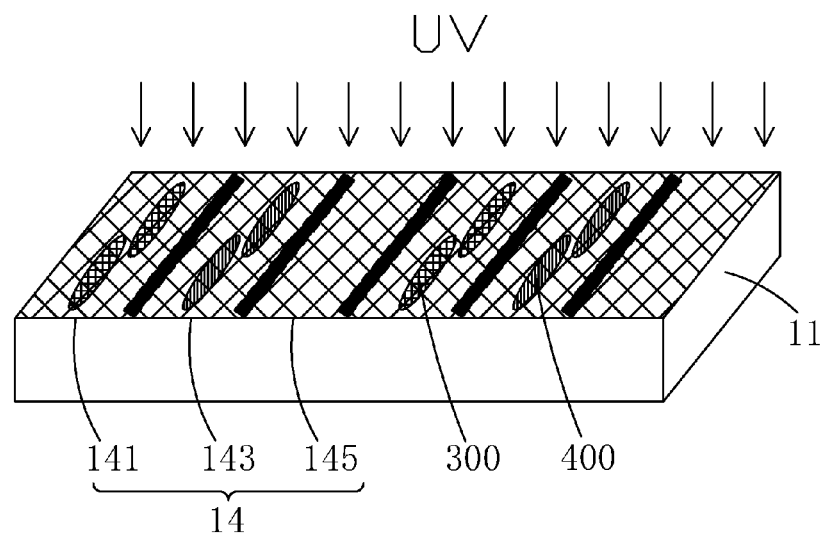
FIGS. 8-9 are schematic diagrams illustrating step 4 of the method of fabricating the COA type liquid crystal display panel of the present application.
Figure 9:
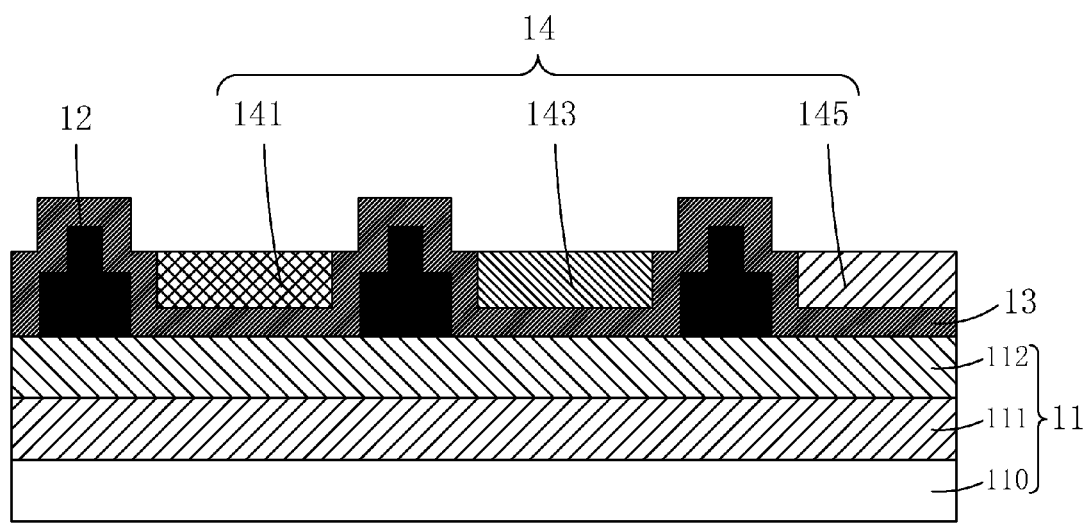

Step 4, as shown in FIGS. 8-9, performing UV irradiation to the plurality of sub pixel regions 120, allowing the reactive monomers 200 react with the reactive liquid crystals 100 in each the sub pixel region 120 to form a polymer network, so that the arrangement directions of the red quantum rods 300 in the red sub pixel regions 121 and the green quantum rods 400 in the green sub pixel regions 122 are fixed by the polymer network, then respectively forming polymer thin films 141 of red quantum rods in the red sub pixel regions 121, polymer thin films 143 of green quantum rods in the green sub pixel regions 122, and polymer thin films 145 in the blue sub pixel regions 123, so as to obtain a color filter film 14, which includes the polymer thin films 141 of red quantum rods, the polymer thin films 143 of green quantum rods, and the polymer thin films 145.

Specifically, in step 1, the plurality of sub pixel regions 120 further including white sub pixel regions; step 3 further including: dropping a mixture including reactive liquid crystals 100, reactive monomers 200, red quantum rods quantum rods 300, and green quantum rods 400 in the white sub pixel regions; after the UV irradiation in step 4, polymer thin films of red and green quantum rods are formed so as to obtain the color filter film 14, which further includes the polymer thin films of red and green quantum rods.

Figure 10:
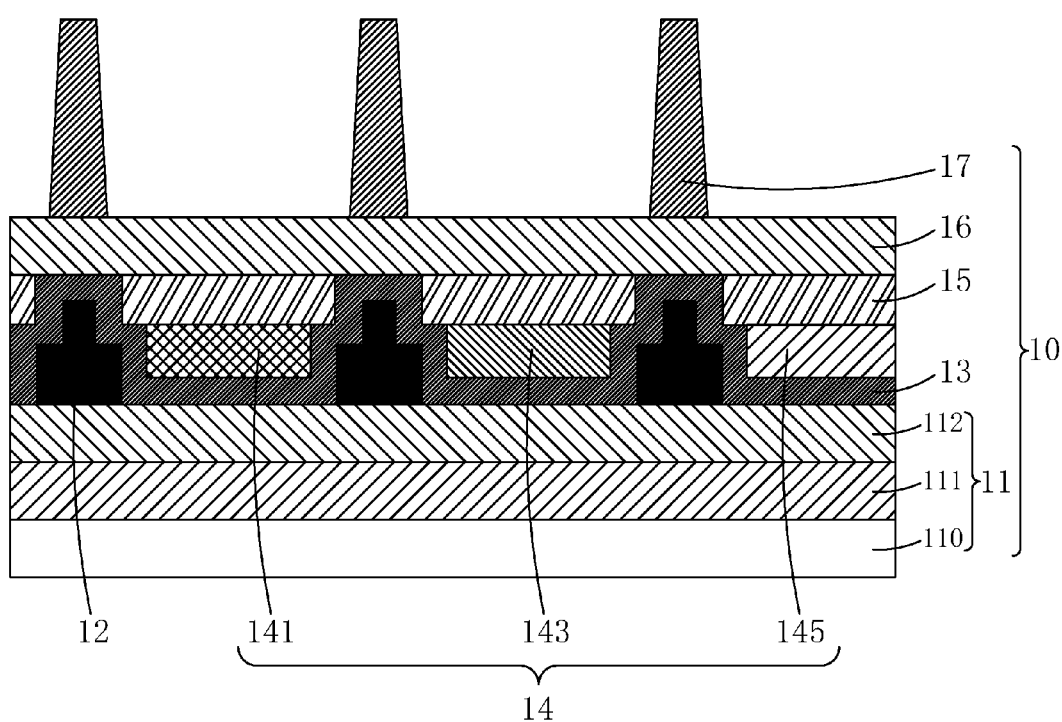
FIG. 10 is a schematic diagram illustrating step 5 of the method of fabricating the COA type liquid crystal display panel of the present application.

Step 5, as shown in FIG. 10, forming a pixel electrode layer 15 on the color filter film 14, forming a second alignment film 16 on the pixel electrode layer 15, forming photoresist spacers 17 on the second alignment film 16 corresponding to the black matrix 12, so as to obtain a lower substrate 10.

Specifically, the pixel electrode 15 includes pixel electrodes respectively corresponding to the plurality of sub pixel regions 120.

Figure 11:
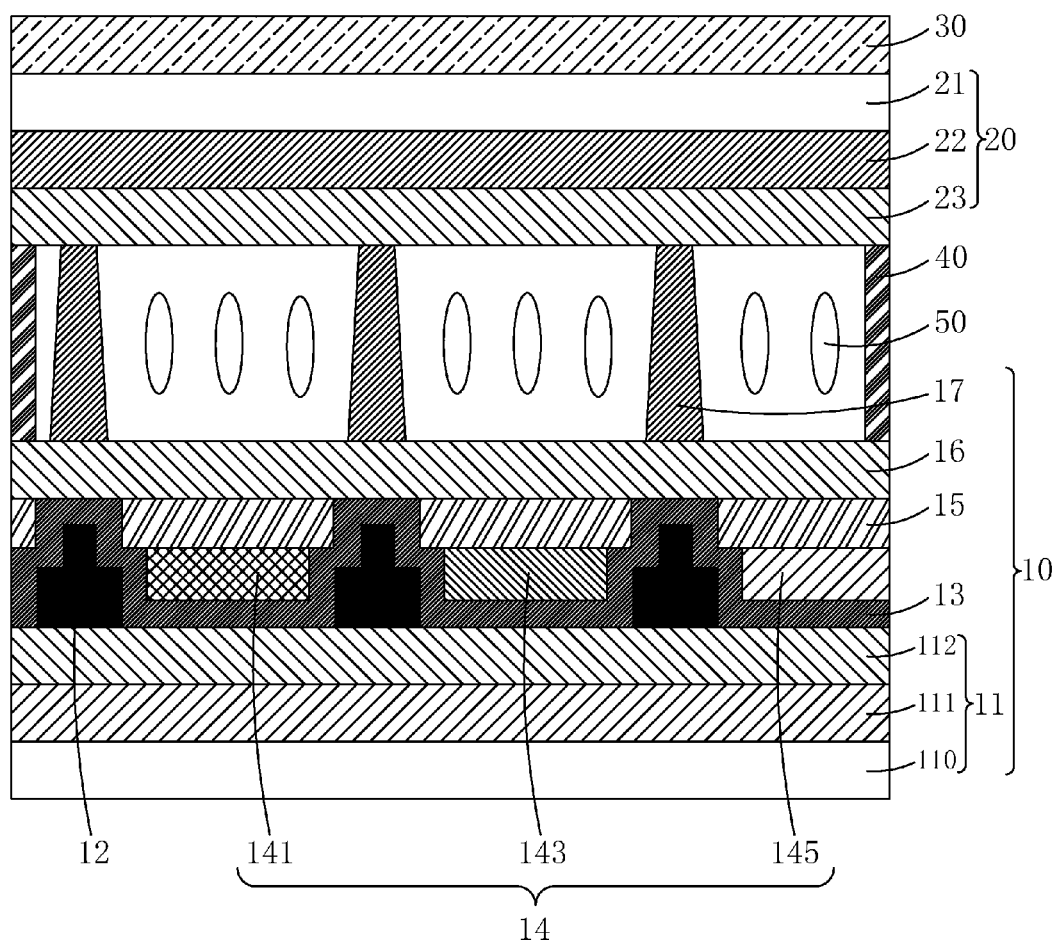
FIG. 11 is a schematic diagram illustrating step 6 of the method of fabricating the COA type liquid crystal display panel and a structure of a COA type liquid crystal display panel of the present application.

Step 6, as shown in FIG. 11, providing an upper substrate 20 and an upper polarizer 30, wherein the upper substrate 20 includes a second substrate 21, a common electrode layer 22 disposed on the second substrate 21, and a third alignment film 23 disposed on the common electrode layer 22;

performing a seal connection of the upper substrate 20 and the lower substrate 10 by using a box glue 40, and simultaneously priming liquid crystal molecules between the upper substrate 20 and the lower substrate 10 to form a liquid crystal layer, then adhering an upper polarizer 30 above the upper substrate 20, so as to complete the fabrication of the COA type liquid crystal display panel.

Specifically, materials of the first alignment film 13, the second alignment film 16, and the third alignment film 23 all are polyimide (PI).

Preferably, materials of the pixel electrode layer 15 and the common electrode layer 22 all are indium tin oxide (ITO).

Specifically, in the COA type liquid crystal display panel of the present application, a light filtering principle of the color filter film 14 is that the red quantum rods 300 in the polymer thin films 141 of red quantum rods and the green quantum rods 400 in the polymer thin films 143 of green quantum rods respectively emit red light and green light under blue backlight excitation, the polymer thin films are transparent that allow the blue backlight pass therethrough, so as to achieve RGB trichromatic display of the liquid crystal display panel.

Further, the color filter film 14 can further include polymer thin films of red and green quantum rods including red quantum rods 300, green quantum rods 400, and a polymer formed by performing UV irradiation to reactive liquid crystals 100 and reactive monomers 200, the red quantum rods 300 and the green quantum rods 400 in the polymer thin films of red and green quantum rods respectively emit red light and green light under blue backlight excitation, and the red light and the green light combine the blue backlight to form white light.

Specifically, the reactive liquid crystals (R-LC) 100 can be a liquid crystal molecule containing rigid ring structures, intermediate linking groups, and double bond structure contained in molecule terminal, such as:

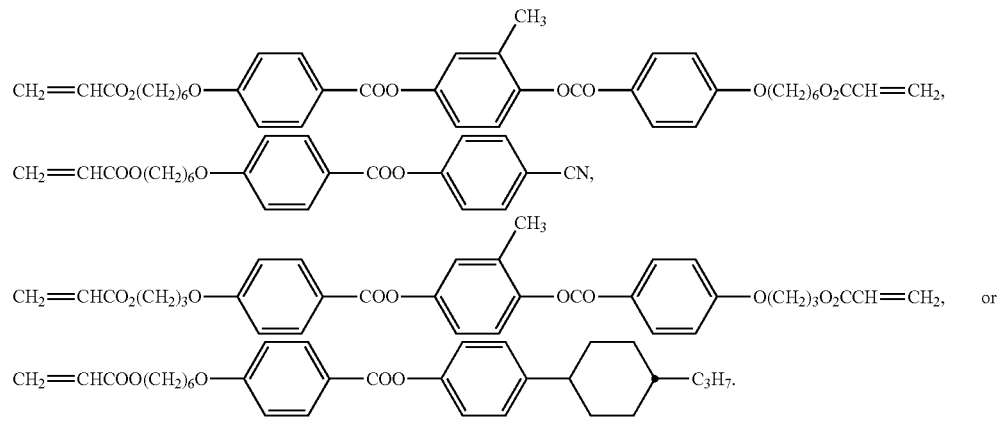

Specifically, the reactive monomers (RM) 200 can be acrylates monomers containing two or more than two carbon-carbon double bonds, such as:

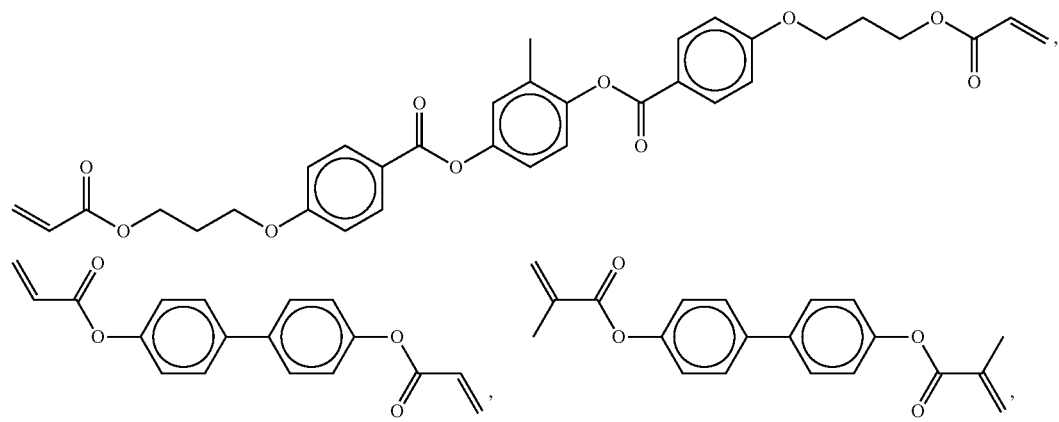

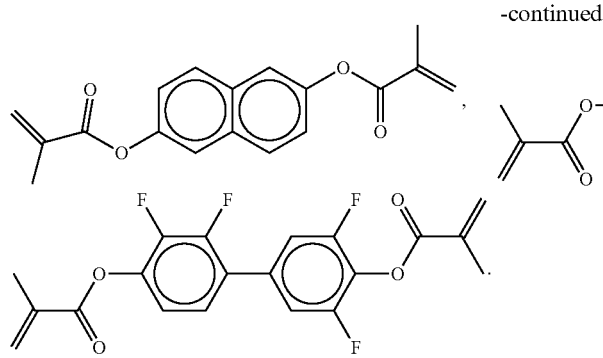

Specifically, the quantum rods (QR) are a quantum rod including a CdSe core and a CdS shell. The quantum rods can emit red or green light after they are excited, the light emitted by the quantum rods can be controlled by a dimension of the core (i.e. a diameter of the core).

The present application provides the COA type liquid crystal display panel of the present application, which utilizes color filter thin film fabricated by polymerizing the reactive liquid crystal, reactive monomers, red quantum-rods and green quantum rods to achieve RGB trichromatic display, the color filter thin film not only increases color saturation, but also omits the lower polarizer for reducing fabrication cost, due that the color filter film under excitation generates polarized light conforming to the polarized direction.

In summary, the present application provides the method of fabricating the COA type liquid crystal display panel and the COA type liquid crystal display panel, which utilizes reactive liquid crystal, reactive monomers, red quantum-rods and green quantum-rods to fabricate a color filter thin film. Due that light generated by the red and green quantum rods in the color filter thin film when they are excited are polarized light, and the red and green quantum rods therein are arranged along the same direction, the excited red and green quantum rods generate red and green linear polarized light conforming to the polarized direction so as to play a role of a lower polarizer and to allow the COA type liquid crystal display panel fabricated by the method not only obtain bright trichromatic light for increasing color saturation, but also omit the lower polarizer for reducing fabrication cost.

To those ordinarily skilled in the art, the above description is intended to cover various modifications and similar arrangements according to the technical solution and spirit of the present application, and the various modifications and similar arrangements are included within the spirit and scope of the appended claims of the present application.

What is claimed is:

1. A method of fabricating a COA type liquid crystal display panel, comprising steps as follows:
   step 1, providing a TFT substrate, wherein the TFT substrate comprises a first substrate, a TFT layer disposed on the first substrate, a passivation layer disposed on the TFT layer, fabricating a black matrix on the TFT substrate, wherein the black matrix partitions the TFT substrate into a plurality of sub pixel regions, which comprises red sub pixel regions, green pixel regions and blue pixel regions;
   step 2, coating an alignment material layer on the TFT substrate and the black matrix, rubbing the alignment material layer to obtain a first alignment film;
   step 3, dropping a mixture comprising reactive liquid crystals, reactive monomers, and red quantum rods in the red sub pixel regions, dropping a mixture comprising reactive liquid crystals, reactive monomers, and green quantum rods in the green sub pixel regions, dropping a mixture comprising reactive liquid crystals and reactive monomers in the blue sub pixel regions;
   after the mixtures are dropped, all the reactive liquid crystals in the plurality of sub pixel regions are arranged along an alignment direction of the first alignment film, due that strong intermolecular forces are formed between the reactive liquid crystals and the red quantum rods in the red sub pixel regions, and formed between the reactive liquid crystals and the green quantum rods in the green sub pixel regions, the red quantum rods and the green quantum rods with the reactive liquid crystals are arranged along the same direction;
   step 4, performing UV irradiation to the plurality of sub pixel regions, allowing the reactive monomers react with the reactive liquid crystals in each the sub pixel region to form a polymer network, so that arrangement directions of the red quantum rods in the red sub pixel regions and the green quantum rods in the green sub pixel regions are fixed by the polymer network, then respectively forming polymer thin films of red quantum rods in the red sub pixel regions, polymer thin films of green quantum rods in the green sub pixel regions, and polymer thin films in the blue sub pixel regions, so as to obtain a color filter film, which comprises the polymer thin films of red quantum rods, the polymer thin films of green quantum rods, and the polymer thin films;
   step 5, forming a pixel electrode layer on the color filter film, forming a second alignment film on the pixel electrode layer, forming photoresist spacers on the second alignment film corresponding to the black matrix, so as to obtain a lower substrate;
   step 6, providing an upper substrate and an upper polarizer, wherein the upper substrate comprises a second substrate, a common electrode layer disposed on the second substrate, and a third alignment film disposed on the common electrode layer;
   performing a seal connection of the upper substrate and the lower substrate by using a box glue, and simultaneously priming liquid crystal molecules between the upper substrate and the lower substrate to form a liquid crystal layer, then adhering an upper polarizer above the upper substrate, so as to complete the fabrication of the COA type liquid crystal display panel.

2. The method of fabricating the COA type liquid crystal display panel according to claim 1, wherein a structural formula of the reactive liquid crystals is:

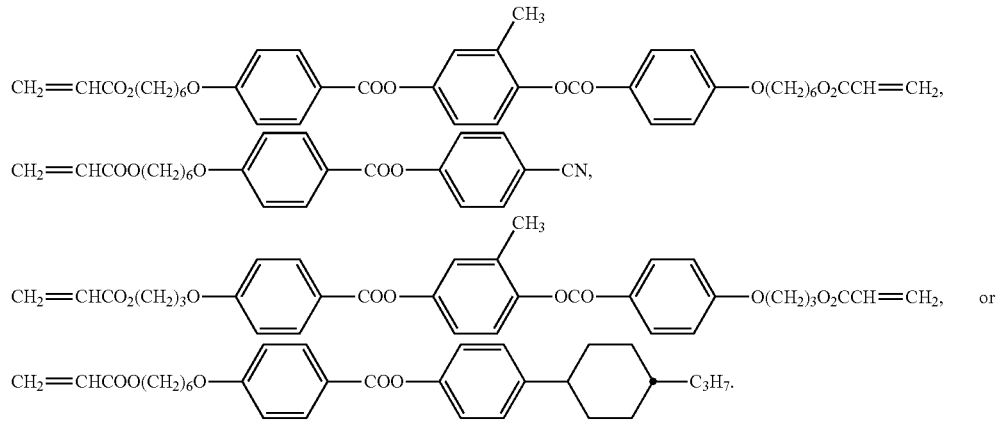

3. The method of fabricating the COA type liquid crystal display panel according to claim 1, wherein the reactive monomers are acrylates monomers containing two or more than two carbon-carbon double bonds.

4. The method of fabricating the COA type liquid crystal display panel according to claim 1, wherein the quantum rods are a quantum rod comprising a CdSe core and a CdS shell.

5. The method of fabricating the COA type liquid crystal display panel according to claim 1, in step 1, the plurality of sub pixel regions further comprising white sub pixel regions; step 3 further comprising: dropping a mixture comprising reactive liquid crystals, reactive monomers, red quantum rods and green quantum rods in the white sub pixel regions; after the UV irradiation in step 4, forming polymer thin films of red and green quantum rods so as to obtain the color filter film, which further comprises the polymer thin films of red and green quantum rods.

6. A COA type liquid crystal display panel, comprising: oppositely disposed an upper substrate and a lower substrate, a box glue disposed peripheral position between the upper substrate and the lower substrate, a liquid crystal layer interposed between the upper substrate and the lower substrate, and a upper polarizer adhered to an upper surface of the upper substrate;

wherein the lower substrate comprises a TFT substrate, a black matrix disposed on the TFT substrate, a first alignment film disposed on the TFT substrate and the black matrix, a color filter film disposed on the first alignment film, a pixel electrode layer disposed on the color filter film, a second alignment film disposed on the pixel electrode layer, and photoresist spacers disposed on the second alignment film corresponding to the black matrix;

wherein the color filter film comprises polymer thin films of red quantum rods, polymer thin films of green quantum rods, and polymer thin films; the polymer thin films of red quantum rods comprises red quantum rods, and a polymer formed by performing UV irradiation to reactive liquid crystals and reactive monomers; the polymer thin films of green quantum rods comprises green quantum rods, and a polymer formed by performing UV irradiation to reactive liquid crystals and reactive monomers; the polymer thin films comprises a polymer by performing UV irradiation to reactive liquid crystals and reactive monomers; the polymer thin films of red quantum rods, the polymer thin films of green quantum rods, and the polymer thin films respectively emit red light, green light, and blue light under blue backlight irradiation.

7. The COA type liquid crystal display panel according to claim 6, wherein the TFT substrate comprises a first substrate, a TFT layer disposed on the first substrate, and a passivation layer disposed on the TFT layer;

the upper substrate comprises a second substrate, a common electrode layer disposed on the second substrate, and a third alignment film disposed on the common electrode layer.

8. The COA type liquid crystal display panel according to claim 6, wherein the color filter film further comprises polymer thin films of red and green quantum rods comprising red quantum rods, green quantum rods, and a polymer formed by performing UV irradiation to reactive liquid crystals and reactive monomers, and the polymer thin films of red and green quantum rods emit white light under blue backlight irradiation.

9. The COA type liquid crystal display panel according to claim 6, wherein a structural formula of the reactive liquid crystals is:

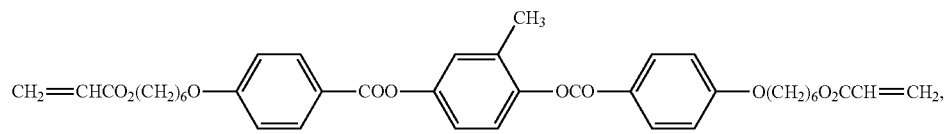

-continued

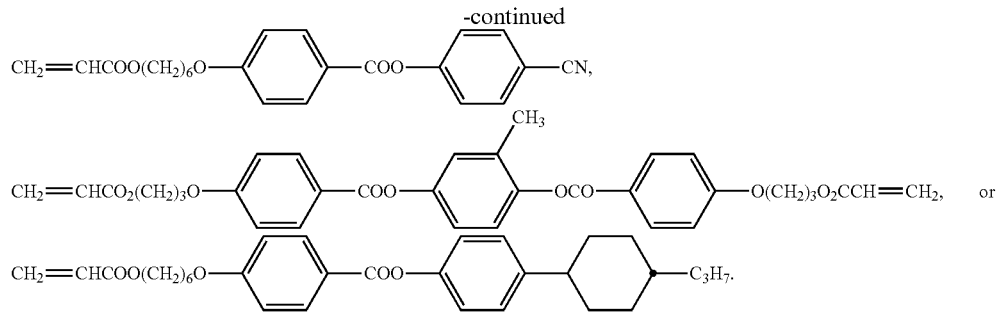

10. The COA type liquid crystal display panel according to claim 6, wherein the reactive monomers are acrylates monomers containing two or more than two carbon-carbon double bonds; the quantum rods are a quantum rod comprising a CdSe core and a CdS shell.

11. A method of fabricating a COA type liquid crystal display panel, comprising steps as follows:

step 1, providing a TFT substrate, wherein the TFT substrate comprises a first substrate, a TFT layer disposed on the first substrate, a passivation layer disposed on the TFT layer, fabricating a black matrix on the TFT substrate, wherein the black matrix partitions the TFT substrate into a plurality of sub pixel regions, which comprises red sub pixel regions, green pixel regions and blue pixel regions;

step 2, coating an alignment material layer on the TFT substrate and the black matrix, rubbing the alignment material layer to obtain a first alignment film;

step 3, dropping a mixture comprising reactive liquid crystals, reactive monomers, and red quantum rods in the red sub pixel regions, dropping a mixture comprising reactive liquid crystals, reactive monomers, and green quantum rods in the green sub pixel regions, dropping a mixture comprising reactive liquid crystals and reactive monomers in the blue sub pixel regions;

after the mixtures are dropped, all the reactive liquid crystals in the plurality of sub pixel regions are arranged along an alignment direction of the first alignment film, due that strong intermolecular forces are formed between the reactive liquid crystals and the red quantum rods in the red sub pixel regions, and formed between the reactive liquid crystals and the green quantum rods in the green sub pixel regions, the red quantum rods and the green quantum rods with the reactive liquid crystals are arranged along the same direction;

step 4, performing UV irradiation to the plurality of sub pixel regions, allowing the reactive monomers react with the reactive liquid crystals in each the sub pixel region to form a polymer network, so that arrangement directions of the red quantum rods in the red sub pixel regions and the green quantum rods in the green sub pixel regions are fixed by the polymer network, then respectively forming polymer thin films of red quantum rods in the red sub pixel regions, polymer thin films of green quantum rods in the green sub pixel regions, and polymer thin films in the blue sub pixel regions, so as to obtain a color filter film, which comprises the polymer thin films of red quantum rods, the polymer thin films of green quantum rods, and the polymer thin films;

step 5, forming a pixel electrode layer on the color filter film, forming a second alignment film on the pixel electrode layer, forming photoresist spacers on the second alignment film corresponding to the black matrix, so as to obtain a lower substrate;

step 6, providing an upper substrate and an upper polarizer, wherein the upper substrate comprises a second substrate, a common electrode layer disposed on the second substrate, and a third alignment film disposed on the common electrode layer;

performing a seal connection of the upper substrate and the lower substrate by using a box glue, and simultaneously priming liquid crystal molecules between the upper substrate and the lower substrate to form a liquid crystal layer, then adhering an upper polarizer above the upper substrate, so as to complete the fabrication of the COA type liquid crystal display panel;

wherein a structural formula of the reactive liquid crystals is:

-continued

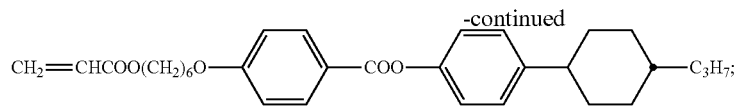

wherein the reactive monomers are acrylates monomers containing two or more than two carbon-carbon double bonds; and wherein the quantum rods are a quantum rod comprising a CdSe core and a CdS shell.

12. The method of fabricating the COA type liquid crystal display panel according to claim 11, in step 1, the plurality of sub pixel regions further comprising white sub pixel regions; step 3 further comprising: dropping a mixture comprising reactive liquid crystals, reactive monomers, red quantum rods and green quantum rods in the white sub pixel regions; after the UV irradiation in step 4, forming polymer thin films of red and green quantum rods so as to obtain the color filter film, which further comprises the polymer thin films of red and green quantum rods.

* * * * *